(12) United States Patent
Okunaga

(10) Patent No.: US 11,437,974 B2
(45) Date of Patent: Sep. 6, 2022

(54) ACOUSTIC WAVE DEVICE

(71) Applicant: Murata Manufacturing Co., Ltd., Nagaokakyo (JP)

(72) Inventor: Hiromu Okunaga, Nagaokakyo (JP)

(73) Assignee: MURATA MANUFACTURING CO., LTD., Kyoto (JP)

(\*) Notice: Subject to any disclaimer, the term of this patent is extended or adjusted under 35 U.S.C. 154(b) by 353 days.

(21) Appl. No.: 16/877,526

(22) Filed: May 19, 2020

(65) Prior Publication Data
US 2020/0395914 A1 Dec. 17, 2020

(30) Foreign Application Priority Data

Jun. 14, 2019 (JP) ............................... JP2019-111173

(51) Int. Cl.
*H03H 9/05* (2006.01)
*H03H 9/02* (2006.01)

(52) U.S. Cl.
CPC ...... *H03H 9/0561* (2013.01); *H03H 9/02015* (2013.01); *H03H 9/02228* (2013.01); *H03H 9/02543* (2013.01); *H03H 9/02842* (2013.01); *H03H 9/0533* (2013.01)

(58) Field of Classification Search
CPC ............. H03H 9/0561; H03H 9/02015; H03H 9/02228; H03H 9/02543; H03H 9/02842; H03H 9/0533; H03H 9/02826; H03H 9/02834; H03H 9/02866; H03H 9/02992; H03H 9/02574
See application file for complete search history.

(56) References Cited

U.S. PATENT DOCUMENTS

2016/0277003 A1 9/2016 Kikuchi et al.
2018/0097502 A1\* 4/2018 Yamamoto ......... H03H 9/02992

FOREIGN PATENT DOCUMENTS

WO 2015/098678 A1 7/2015

\* cited by examiner

*Primary Examiner* — Jeffrey M Shin
(74) *Attorney, Agent, or Firm* — Keating & Bennett, LLP

(57) ABSTRACT

An acoustic wave device includes a support substrate including a main surface including first and second regions adjacent to each other in a plan view; a multilayer body including an intermediate layer in the first region of the support substrate and a piezoelectric layer on the intermediate layer, and including a side surface; an IDT electrode on the piezoelectric layer of the multilayer body; and an insulating film in the second region of the support substrate to cover the side surface of the multilayer body. An angle defined between the main surface of the support substrate and the side surface of the multilayer body is a tilt angle, and the side surface of the multilayer body includes portions having different tilt angles at a portion covered with the insulating film.

17 Claims, 5 Drawing Sheets

ACOUSTIC WAVE DEVICE

CROSS REFERENCE TO RELATED APPLICATIONS

This application claims the benefit of priority to Japanese Patent Application No. 2019-111173 filed on Jun. 14, 2019. The entire contents of this application are hereby incorporated herein by reference.

BACKGROUND OF THE INVENTION

1. Field of the Invention

The present invention relates to an acoustic wave device.

2. Description of the Related Art

Acoustic wave devices have been widely used for filters of cellular phones and the like. International Publication No. 2015/098678 discloses an example of an acoustic wave device. In this acoustic wave device, a multilayer film including a piezoelectric thin film is provided on a support substrate, and an IDT electrode (Interdigital Transducer) is provided on the piezoelectric thin film. In a region where the multilayer film is removed on the support substrate, an insulating film is provided so as to cover the side surface of the multilayer film.

In the acoustic wave device described above, the multilayer film and the insulating film have different thermal expansion coefficients from each other. Therefore, when a temperature change due to heating or the like in the manufacturing process occurs, due to differences in the degree of expansion or contraction between the multilayer film and the insulating film, there is a possibility that the insulating film will peel off from the multilayer film. Due to occurrence of peeling as described above, for example, there is a possibility that disconnection of wiring will occur.

SUMMARY OF THE INVENTION

Preferred embodiments of the present invention provide acoustic wave devices in each of which peeling of an insulating film from a multilayer body including a piezoelectric layer is unlikely to occur.

An acoustic wave device according to a preferred embodiment of the present invention includes a support substrate including a main surface including a first region and a second region adjacent to the first region in a plan view; a multilayer body including an intermediate layer provided in the first region of the support substrate and a piezoelectric layer provided on the intermediate layer, and including a side surface; an IDT electrode provided on the piezoelectric layer of the multilayer body; and an insulating film provided in the second region of the support substrate to cover the side surface of the multilayer body, in which an angle defined between the main surface of the support substrate and the side surface of the multilayer body is a tilt angle, and the side surface of the multilayer body includes portions different in the tilt angle at a portion covered with the insulating film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through description of preferred embodiments of the present invention with reference to the drawings.

It should be noted that each of the preferred embodiments described in the present specification is exemplary and it is to be understood that a partial replacement or combination of features and elements among different preferred embodiments may be provided.

Figure 1:
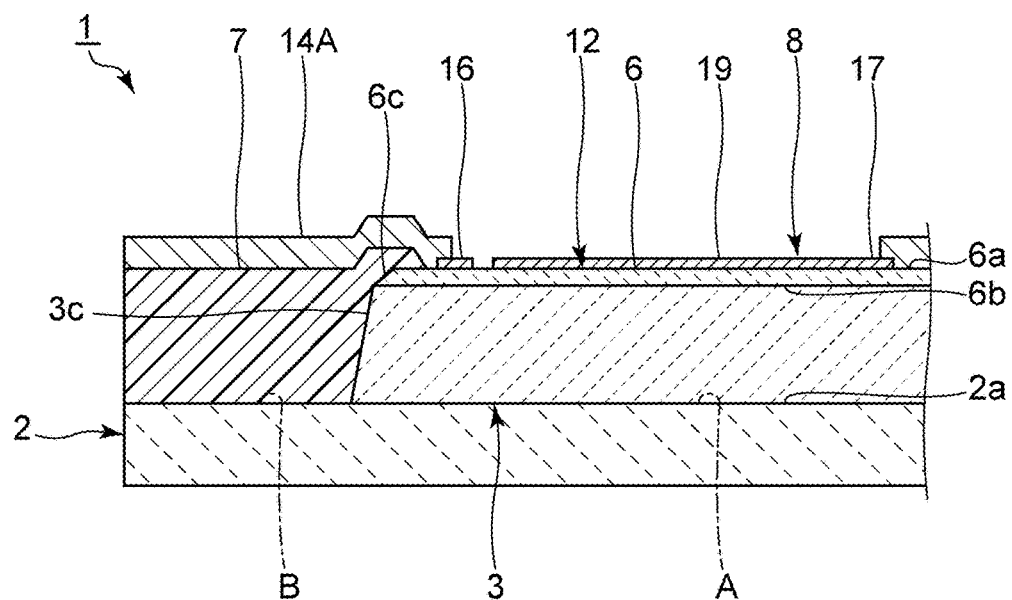
FIG. 1 is a cross-sectional view showing a vicinity of an IDT electrode in an acoustic wave device according to a first preferred embodiment of the present invention.
Figure 2:
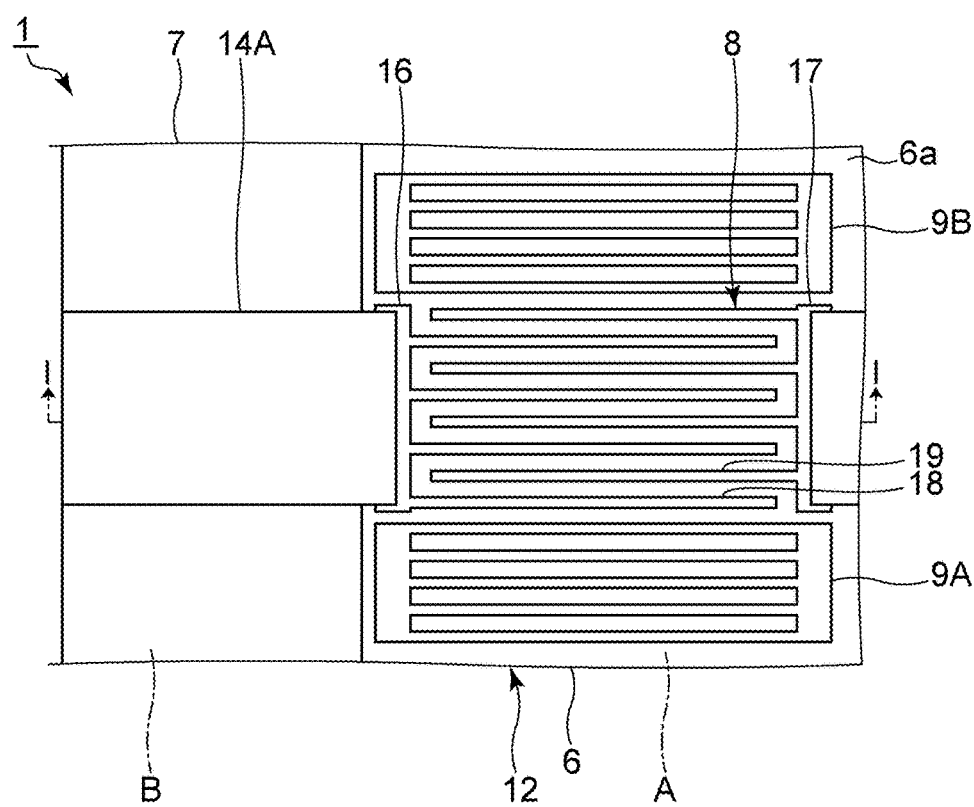
FIG. 2 is a plan view showing a vicinity of the IDT electrode in the acoustic wave device according to the first preferred embodiment of the present invention.

FIG. 1 is a cross-sectional view showing a vicinity of an IDT electrode in an acoustic wave device according to a first preferred embodiment of the present invention. FIG. 2 is a plan view showing a vicinity of the IDT electrode in the acoustic wave device according to the first preferred embodiment. Note that FIG. 1 is a cross-sectional view showing a portion corresponding to a cross section taken along the line I-I in FIG. 2.

As shown in FIG. 1, an acoustic wave device 1 includes a support substrate 2. The support substrate 2 includes a main surface 2a including a first region A and a second region B adjacent to the first region A in a plan view. Note that the term "a plan view" in the present specification refers to a direction viewed from the upper side in FIG. 1. In the first preferred embodiment, the second region B surrounds the first region A. A multilayer body 12 including an intermediate layer 3 and a piezoelectric layer 6 is provided in the first region A on the main surface 2a of the support substrate 2. More specifically, the intermediate layer 3 is provided on the main surface 2a of the support substrate 2, and the piezoelectric layer 6 is provided on the intermediate layer 3. The piezoelectric layer 6 includes a first main surface 6a and a second main surface 6b which face each other. The second main surface 6b is located on the intermediate layer 3 side. The intermediate layer 3 and the piezoelectric layer each include a side surface. A side surface 3c of the intermediate layer 3 and a side surface 6c of the piezoelectric layer 6 define a side surface of the multilayer body 12.

In the second region B on the main surface 2a of the support substrate 2, an insulating film 7 covers the side surface of the multilayer body 12. More specifically, the insulating film 7 covers the entire or substantially the entire side surface of the multilayer body 12. The insulating film 7 extends from the side surface of the multilayer body 12 to the first main surface 6a of the piezoelectric layer 6. Note that the insulating film 7 may not necessarily cover the entire or substantially the entire side surface of the multilayer body 12, and may not necessarily extend to the first main surface 6a of the piezoelectric layer 6.

Here, an angle defined between the main surface 2a of the support substrate 2 and the side surface of the multilayer body 12 is a tilt angle. When the side surface of the multilayer body 12 tilts toward the center side of the multilayer body 12 relative to a direction orthogonal or substantially orthogonal to the main surface 2a of the support substrate 2, the tilt angle is less than about 90°. On the other hand, when the side surface of the multilayer body 12 tilts toward the opposite side to the center side of the multilayer body 12 relative to the direction orthogonal or substantially orthogonal to the main surface 2a of the support substrate 2, the tilt angle is larger than about 90°. In the multilayer body 12 shown in FIG. 1, the tilt angle of the side surface 3c of the intermediate layer 3 and the tilt angle of the side surface 6c of the piezoelectric layer 6 are each preferably less than about 90°, for example.

In the first preferred embodiment, the tilt angle of the side surface 3c of the intermediate layer 3 and the tilt angle of the side surface 6c of the piezoelectric layer 6 are preferably different from each other. More specifically, the tilt angle of the side surface 6c of the piezoelectric layer 6 is preferably smaller than the tilt angle of the intermediate layer 3. Note that it is sufficient that the side surface of the multilayer body 12 includes portions having different tilt angles.

As shown in FIG. 2, an IDT electrode 8 is provided on the piezoelectric layer 6 of the multilayer body 12. By applying an AC voltage to the IDT electrode 8, an acoustic wave is excited. A pair of a reflector 9A and a reflector 9B are provided on both sides in an acoustic wave propagation direction of the IDT electrode 8 on the piezoelectric layer 6. The acoustic wave device 1 according to the first preferred embodiment is an acoustic wave resonator. However, the acoustic wave device according to preferred embodiments of the present invention is not limited to an acoustic wave resonator, and may be, for example, a filter device including a plurality of acoustic wave resonators, a multiplexer including the filter device, or the like.

The IDT electrode 8 includes a first busbar 16 and a second busbar 17 which face each other. The IDT electrode 8 includes a plurality of first electrode fingers 18 each including one end connected to the first busbar 16. Furthermore, the IDT electrode 8 includes a plurality of second electrode fingers 19 each including one end connected to the second busbar 17. The plurality of first electrode fingers 18 and the plurality of second electrode fingers 19 interdigitate with each other. The IDT electrode 8, and the reflector 9A and the reflector 9B may each include a laminated metal film in which a plurality of metal layers are laminated, or may include a single-layered metal film.

In the first preferred embodiment, the insulating film 7 is preferably a photosensitive polyimide film, for example.

Note that the material of the insulating film 7 is not limited to that described above. As a material for the insulating film 7, a photosensitive insulating resin is preferably included, for example. Alternatively, as a material for the insulating film 7, an appropriate insulating material for which patterning may be performed by RIE (Reactive Ion Etching) or the like may be used.

The piezoelectric layer 6 is preferably a lithium tantalate layer, for example. Note that the material of the piezoelectric layer 6 is not limited to that described above, and for example, lithium niobate, zinc oxide, aluminum nitride, crystal, PZT, or the like may be used.

The intermediate layer 3 shown in FIG. 1 is a single-layered low acoustic velocity film. The low acoustic velocity film is a film relatively low in acoustic velocity. More specifically, an acoustic velocity of a bulk wave propagating through the low acoustic velocity film is lower than an acoustic velocity of a bulk wave propagating through the piezoelectric layer 6. In the first preferred embodiment, the low acoustic velocity film is preferably a silicon oxide film, for example. Silicon oxide is represented by $SiO_x$. Here, x is an arbitrary positive number. In the acoustic wave device 1, silicon oxide defining the low acoustic velocity film is preferably $SiO_2$, for example. Note that the material of the low acoustic velocity film is not limited to that described above, and for example, a material including, as a main component, glass, silicon oxynitride, tantalum oxide, or a compound provided by adding fluorine, carbon, or boron to silicon oxide may be used.

Note that the intermediate layer 3 is not limited to a low acoustic velocity film. The intermediate layer 3 may include a laminated film in which a plurality of layers are laminated.

In the acoustic wave device 1, the support substrate 2 is a high acoustic velocity support substrate relatively high in acoustic velocity. More specifically, an acoustic velocity of a bulk wave propagating through the high acoustic velocity support substrate is higher than an acoustic velocity of an acoustic wave propagating through the piezoelectric layer 6. In the first preferred embodiment, the support substrate 2 is preferably a silicon substrate, for example. Note that the material of the support substrate 2 as a high acoustic velocity support substrate is not limited to that described above, and may be, for example, a medium including, as a main component, the material such as aluminum oxide, silicon carbide, silicon nitride, silicon oxynitride, sapphire, lithium tantalate, lithium niobate, crystal, alumina, zirconia, cordierite, mullite, steatite, forsterite, magnesia, DLC (diamond-like carbon) film or diamond, or the like.

Since the acoustic wave device 1 has a laminated structure in which the support substrate 2 as a high acoustic velocity support substrate, the intermediate layer 3 as a low acoustic velocity film, and the piezoelectric layer 6 are laminated in this order, acoustic waves are able to be effectively confined in the piezoelectric layer 6 side.

As shown in FIG. 1 and FIG. 2, a metal film 14A extending from the top of the piezoelectric layer 6 to the top of the insulating film 7 is provided. In the first preferred embodiment, the metal film 14A is a wiring electrode electrically connected to the first busbar 16 of the IDT electrode 8. However, a metal film, which extends from the top of the piezoelectric layer 6 to the top of the insulating film 7, other than the wiring electrode may be provided.

A feature of the first preferred embodiment is that the insulating film 7 covering the side surface of the multilayer body 12 is included, and the side surface of the multilayer body 12 includes portions having different tilt angles at the portion covered with the insulating film 7. Therefore, the area of the interface where the side surface of the multilayer body 12 and the insulating film 7 are in contact with each other is able to be increased, and adhesive force between the multilayer body 12 and the insulating film 7 is able to be significantly increased. Accordingly, peeling of the insulating film 7 from the multilayer body 12 is unlikely to occur.

The tilt angle of the side surface 6c of the piezoelectric layer 6 is preferably smaller than the tilt angle of the side surface 3c of the layer adjacent to the piezoelectric layer 6 in the intermediate layer 3, for example. Note that in the first preferred embodiment, since the intermediate layer 3 is a single-layered low acoustic velocity film, the layer adjacent to the piezoelectric layer 6 in the intermediate layer 3 is the entire intermediate layer 3. Because the tilt angle of the side surface 6c of the piezoelectric layer 6 is small, in force components of stress applied to the interface between the multilayer body 12 and the insulating film 7, a ratio of a component in a shearing direction increases. Here, the shearing adhesive force is larger than the adhesive force in the vertical direction. Therefore, peeling of the insulating film 7 from the multilayer body 12 is able to be significantly reduced or prevented.

Figure 3:
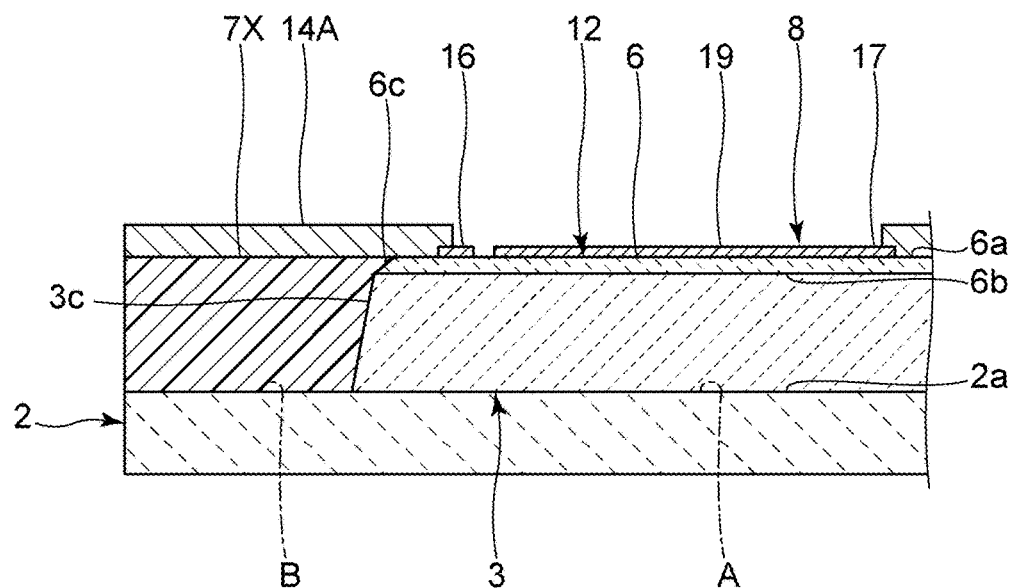
FIG. 3 is a cross-sectional view showing a vicinity of the IDT electrode in the acoustic wave device according to a first modification of the first preferred embodiment of the present invention.

The insulating film 7 may not necessarily extend to the first main surface 6a of the piezoelectric layer 6. For example, in a first modification of the first preferred embodiment shown in FIG. 3, an insulating film 7X covers the entire side surface of the multilayer body 12 including the side surface 6c of the piezoelectric layer 6, but does not extend to the first main surface 6a of the piezoelectric layer 6.

However, as in the first preferred embodiment, the insulating film 7 preferably extends to the first main surface 6a of the piezoelectric layer 6, for example. With this, in the force components of the stress applied to the interface between the multilayer body 12 and the insulating film 7, the ratio of the component in the shearing direction further increases. Accordingly, peeling of the insulating film 7 from the multilayer body 12 is less likely to occur.

The metal film 14A preferably extends from the top of the piezoelectric layer 6 to the top of the insulating film 7, for example. Since metal is high in strength against force in a stretching direction, when being applied to the interface between the multilayer body 12 and the insulating film 7, peeling off the insulating film 7 from the intermediate layer 3 is able to be significantly reduced or prevented.

Figure 4:
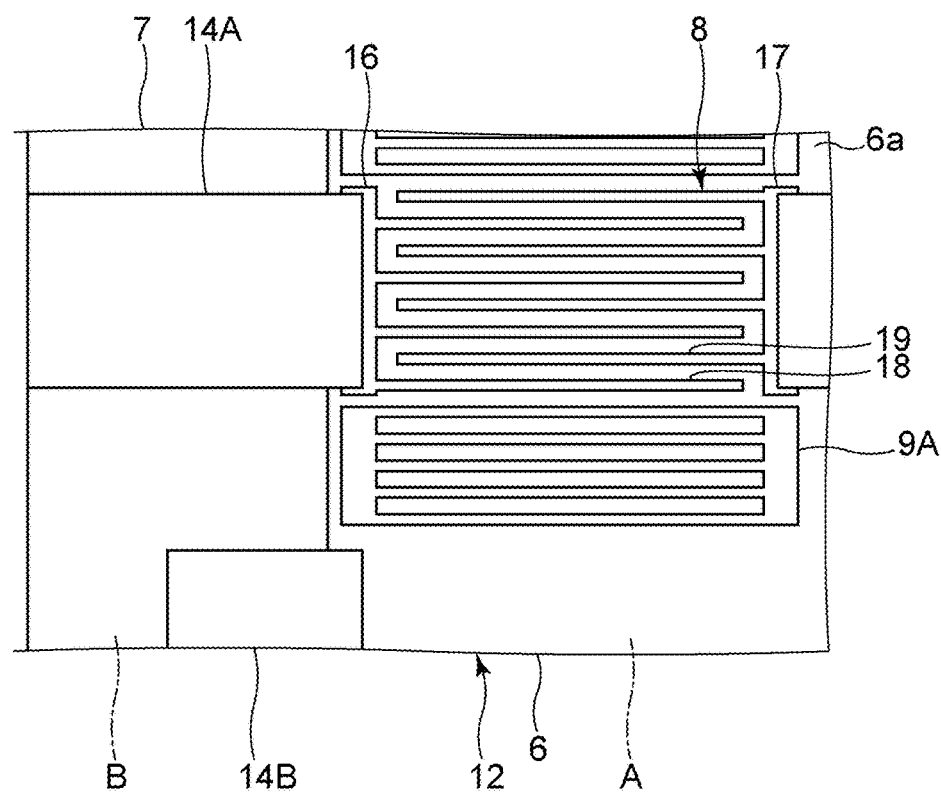
FIG. 4 is a plan view showing a vicinity of the IDT electrode in the acoustic wave device according to a second modification of the first preferred embodiment of the present invention.

The metal film 14A may be a metal film other than the wiring electrode. Note that in a second modification of the first preferred embodiment shown in FIG. 4, the metal film 14A as a wiring electrode and a metal film 14B other than the wiring electrode extend from the top of the piezoelectric layer 6 to the top of the insulating film 7. Therefore, peeling of the insulating film 7 from the multilayer body 12 is less likely to occur, and disconnection of the wiring electrode is unlikely to occur. In addition, the boundary between the multilayer body 12 and the insulating film 7 in a plan view may be covered with the metal film 14B. Accordingly, moisture is able to be significantly reduced or prevented from entering into the interface between the multilayer body 12 and the insulating film 7.

In the first preferred embodiment, the insulating film is in contact with the entire or substantially the entire circumference of the side surface of the multilayer body 12 in a plan view. Note that it is sufficient that the insulating film 7 is in contact with at least a portion of the side surface of the multilayer body 12 in a plan view.

Although the tilt angle of the side surface of each layer of the multilayer body 12 in the acoustic wave device 1 is less than about 90°, the multilayer body 12 may include a layer in which the tilt angle of the side surface is substantially equal to or more than about 90°.

Figure 5:
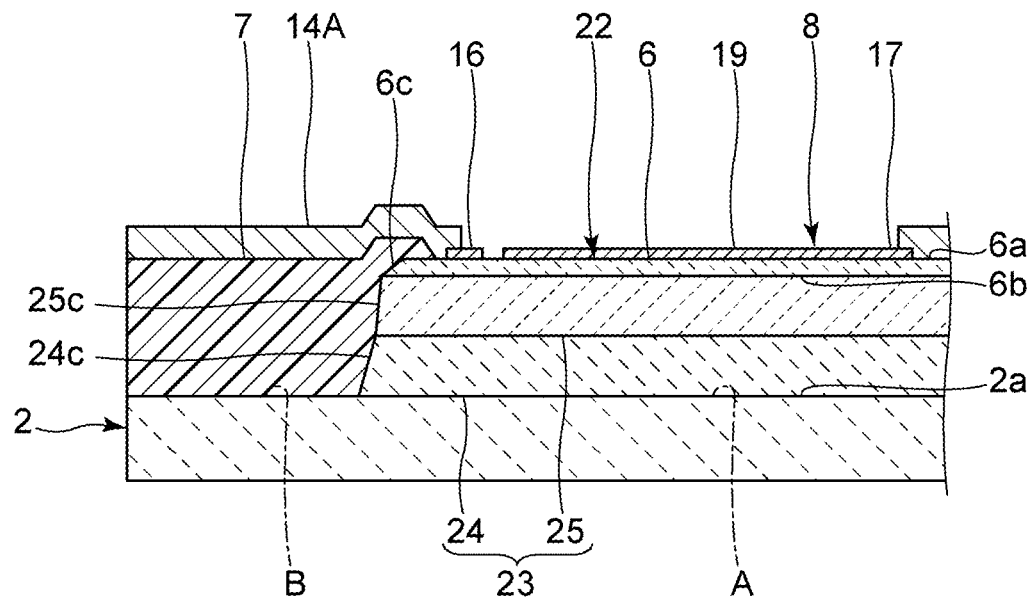
FIG. 5 is a cross-sectional view showing a vicinity of an IDT electrode in an acoustic wave device according to a second preferred embodiment of the present invention.

FIG. 5 is a cross-sectional view showing a vicinity of an IDT electrode in an acoustic wave device according to a second preferred embodiment of the present invention.

The second preferred embodiment is different from the first preferred embodiment in that an intermediate layer 23 includes a high acoustic velocity film 24 provided between the support substrate 2 and a low acoustic velocity film 25. Aside from the point described above, the acoustic wave device according to the second preferred embodiment has the same or similar features and elements as that of the acoustic wave device 1 according to the first preferred embodiment.

The high acoustic velocity film 24 is a film relatively high in acoustic velocity. More specifically, an acoustic velocity of a bulk wave propagating through the high acoustic velocity film is higher than an acoustic velocity of an acoustic wave propagating through the piezoelectric layer 6. A material of the high acoustic velocity film 24 may be, for example, a medium including, as a main component, the material such as aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, DLC (diamond-like carbon) film or diamond, or the like.

Note that if the high acoustic velocity film 24 is included, the support substrate 2 does not need to be the high acoustic velocity support substrate. Accordingly, as a material of the support substrate 2, for example, a piezoelectric material such as, for example, aluminum oxide, diamond, sapphire, lithium tantalate, lithium niobate, crystal, or the like, various ceramics such as alumina, magnesia, silicon nitride, aluminum nitride, silicon carbide, zirconia, cordierite, mullite, steatite, forsterite, or the like, a dielectric such as glass or the like, a semiconductor such as silicon, gallium nitride, or the like, a resin, or the like may be used.

Since the acoustic wave device according to the second preferred embodiment has a laminated structure in which the high acoustic velocity film 24, the low acoustic velocity film 25, and the piezoelectric layer 6 are laminated in this order, acoustic waves are able to be effectively confined in the piezoelectric layer 6 side.

The intermediate layer 23 includes a laminated film including the high acoustic velocity film 24 and the low acoustic velocity film 25. The high acoustic velocity film 24 includes a side surface 24c, and the low acoustic velocity film 25 includes a side surface 25c. A tilt angle of the side surface 24c of the high acoustic velocity film 24 and a tilt angle of the side surface 25c of the low acoustic velocity film 25 are preferably different from each other. Furthermore, the tilt angle of the side surface 25c of the low acoustic velocity film 25 which is a layer adjacent to the piezoelectric layer 6 in the intermediate layer 23 and the tilt angle of the side surface 6c of the piezoelectric layer 6 are preferably different from each other. As described above, in the second preferred embodiment, the side surface of the intermediate layer 23 and the side surface 6c of the piezoelectric layer 6 are each tilted, and the side surface of a multilayer body 22 has an uneven structure in the cross-sectional view shown in FIG. 5. Accordingly, the area of the interface between the multilayer body 22 and the insulating film 7 is able to be significantly increased, and peeling of the insulating film 7 from the multilayer body 22 is able to be significantly reduced or prevented.

Note that if the side surface of the intermediate layer 23 including the laminated film includes portions having different tilt angles, the tilt angle of the side surface 25c of the layer adjacent to the piezoelectric layer 6 in the intermediate layer 23 and the tilt angle of the side surface 6c of the piezoelectric layer 6 may not necessarily be different from each other. However, as in the second preferred embodiment, by difference between the tilt angle of the side surface 25c of the layer adjacent to the piezoelectric layer 6 in the intermediate layer 23 and the tilt angle of the side surface 6c of the piezoelectric layer 6, the insulating film 7 is less likely to be peeled off from the multilayer body 22.

As in the second preferred embodiment, if the side surface of the intermediate layer 23 in the multilayer body 22 includes portions having different tilt angles, the insulating film 7 may not necessarily extend to the side surface 6c of the piezoelectric layer 6. Accordingly, the side surface of the multilayer body 22 includes portions having different tilt angles at a portion covered with the insulating film 7. Thus, the insulating film 7 is unlikely to be peeled off from the multilayer body 22.

However, the insulating film 7 preferably extends to the side surface 6c of the piezoelectric layer 6, for example. Accordingly, the area of the interface between the multilayer body 22 and the insulating film 7 is able to be significantly increased, and peeling of the insulating film 7 from the multilayer body 22 is able to be significantly reduced or prevented. In addition, peeling of the piezoelectric layer 6 from the intermediate layer 23 is also able to be significantly reduced or prevented.

Figure 6:
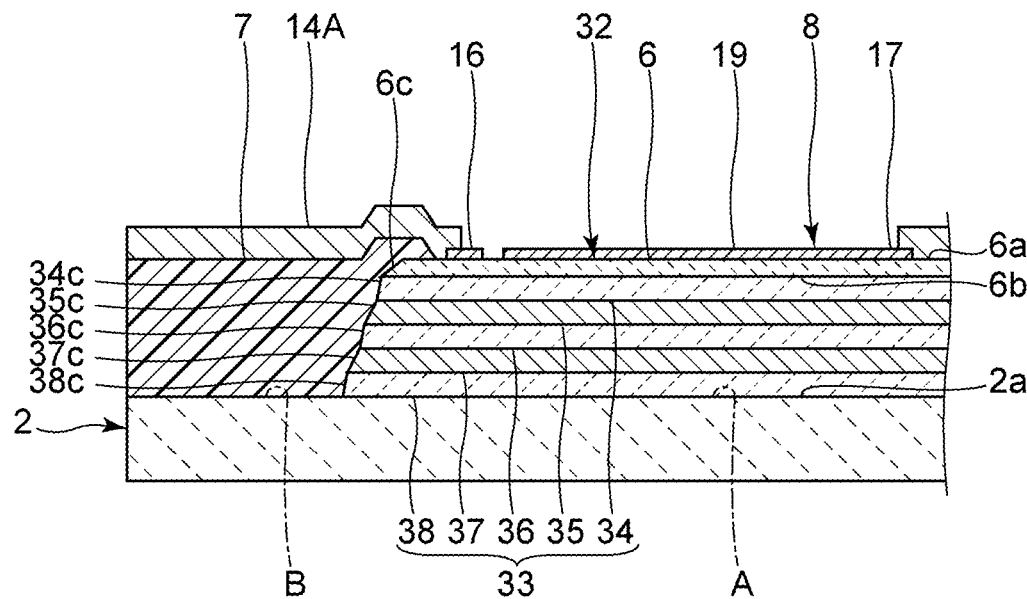
FIG. 6 is a cross-sectional view showing a vicinity of an IDT electrode in an acoustic wave device according to a third preferred embodiment of the present invention.

FIG. 6 is a cross-sectional view showing a vicinity of an IDT electrode in an acoustic wave device according to a third preferred embodiment of the present invention.

The third preferred embodiment is different from the first preferred embodiment in that an intermediate layer 33 is an acoustic reflection film and the piezoelectric layer 6 is a lithium niobate layer. Aside from the points described above, the acoustic wave device according to the third preferred embodiment has the same or similar features and elements as that of the acoustic wave device 1 according to the first preferred embodiment.

The acoustic reflection film as the intermediate layer 33 includes a laminated film including a plurality of acoustic impedance layers. More specifically, the acoustic reflection film includes a plurality of low acoustic impedance layers relatively low in acoustic impedance, and a plurality of high acoustic impedance layers relatively high in acoustic impedance. In the acoustic reflection film as the intermediate layer 33, a low acoustic impedance layer 34, a high acoustic impedance layer 35, a low acoustic impedance layer 36, a high acoustic impedance layer 37, and a low acoustic impedance layer 38 are laminated in this order. As described above, in the third preferred embodiment, in the acoustic reflection film, the low acoustic impedance layers and the high acoustic impedance layers are alternately laminated. Note that the low acoustic impedance layer 34 is a layer located closest to the piezoelectric layer 6 side in the acoustic reflection film.

The acoustic reflection film as the intermediate layer preferably includes three layers of low acoustic impedance layers, and includes two layers of high acoustic impedance layers, for example. However, it is sufficient that the acoustic reflection film includes at least one low acoustic impedance layer and at least one high acoustic impedance layer.

In the third preferred embodiment, each of the low acoustic impedance layers is preferably a silicon oxide layer, for example. Note that the material of the low acoustic impedance layer is not limited to that described above, and for example, aluminum or the like may be used.

Each of the high acoustic impedance layer preferably includes, for example, a laminated film in which a Ti layer, a Pt layer, and a Ti layer are laminated in this order. Note that the high acoustic impedance layer may include a single-layered metal film or a dielectric film. As a material of the high acoustic impedance layer, for example, a metal such as Pt, W, or the like, or a dielectric such as aluminum nitride, silicon nitride, or the like may be used.

Since the acoustic wave device according to the third preferred embodiment includes the acoustic reflection film, acoustic waves are able to be effectively confined in the piezoelectric layer 6 side. Note that if the acoustic reflection film is included, the support substrate 2 does not need to be the high acoustic velocity support substrate.

The low acoustic impedance layer 34 includes a side surface 34c, the low acoustic impedance layer 36 includes a side surface 36c, and the low acoustic impedance layer 38 includes a side surface 38c. The high acoustic impedance layer 35 includes a side surface 35c, and the high acoustic impedance layer 37 includes a side surface 37c. In the third preferred embodiment, the tilt angles of the respective side surfaces of the low acoustic impedance layer and the high acoustic impedance layer which are adjacent to each other are preferably different from each other. Therefore, in the cross-sectional view shown in FIG. 6, the side surfaces of the respective layers of the intermediate layer 33 are each tilted, and the side surface of the intermediate layer 33 has an uneven structure. Accordingly, the area of the interface between the multilayer body 32 and the insulating film 7 is able to be significantly increased, and peeling of the insulating film 7 from the multilayer body 32 is able to be significantly reduced or prevented.

Figure 7:
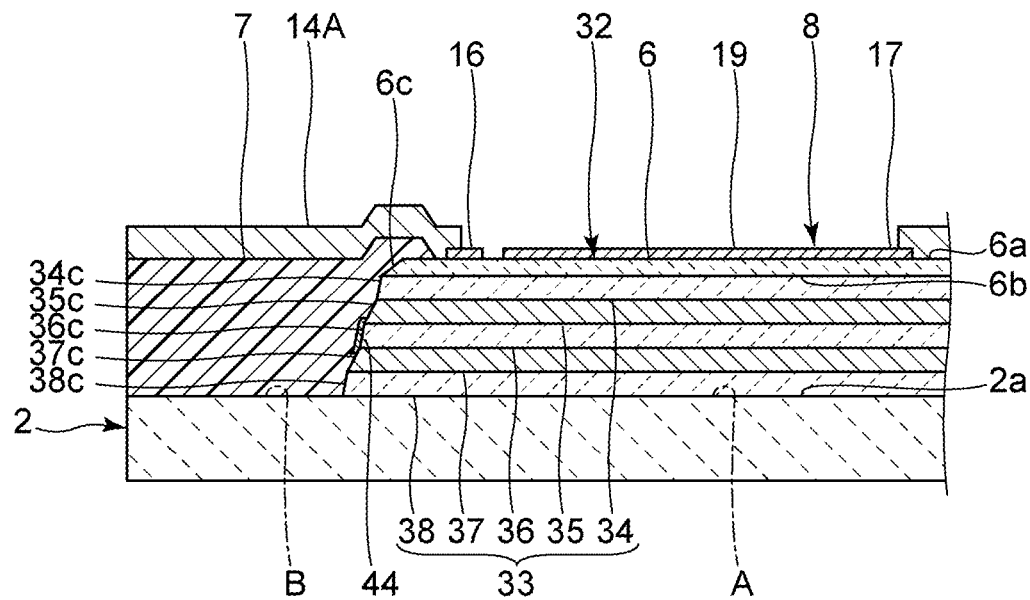
FIG. 7 is a cross-sectional view showing a vicinity of an IDT electrode in an acoustic wave device according to a fourth preferred embodiment of the present invention.

FIG. 7 is a cross-sectional view showing a vicinity of an IDT electrode in an acoustic wave device according to a fourth preferred embodiment of the present invention.

The fourth preferred embodiment is different from the third preferred embodiment in that a connection electrode 44 electrically connecting the high acoustic impedance layer 35 and the high acoustic impedance layer 37 is included. Aside from the point described above, the acoustic wave device according to the fourth preferred embodiment has the same or similar features and elements as that of the acoustic wave device according to the third preferred embodiment.

The high acoustic impedance layer 35 and the high acoustic impedance layer 37 of the fourth preferred embodiment are metal layers, and the low acoustic impedance layer 36 is an insulating layer provided between the plurality of metal layers. The connection electrode 44 is provided on the side surface 36c of the insulating layer and is connected to the plurality of metal layers. The plurality of metal layers is electrically short-circuited by the connection electrode 44. As a result, the metal layers have the same or substantially the same potential. Accordingly, an unnecessary vibration mode is able to be significantly reduced or prevented.

The connection electrode 44 is preferably provided on the entire or substantially the entire circumference in a plan view of the side surface 36c of the low acoustic impedance layer 36 as the insulating layer, for example. Accordingly, moisture is able to be significantly reduced or prevented from entering into the insulating layer. Note that it is sufficient that the connection electrode 44 is provided on at least a portion of the side surface 36c of the insulating layer in a plan view.

In the fourth preferred embodiment, similar to the third preferred embodiment, in the cross-sectional view shown in FIG. 7, the side surfaces of the respective layers of the intermediate layer 33 are each tilted, and the side surface of the intermediate layer 33 as the acoustic reflection film has an uneven structure. Accordingly, the area of the interface between the multilayer body 32 and the insulating film 7 is able to be significantly increased, and peeling of the insulating film 7 from the multilayer body 32 is able to be significantly reduced or prevented.

Figure 8:
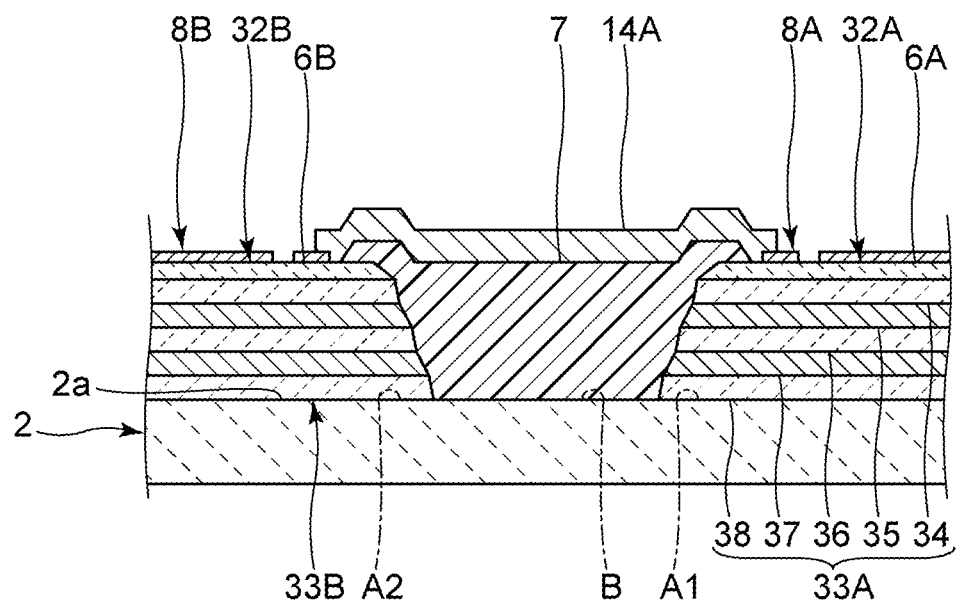
FIG. 8 is a cross-sectional view showing a vicinity of an IDT electrode in an acoustic wave device according to a fifth preferred embodiment of the present invention.
Figure 9:
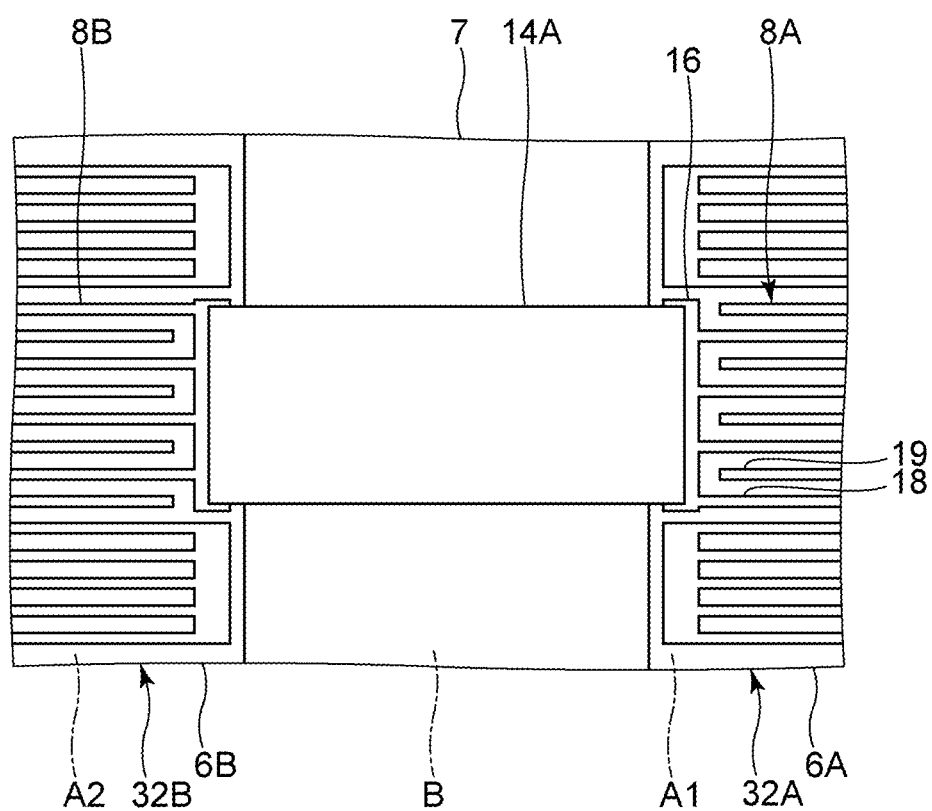
FIG. 9 is a plan view showing a vicinity of the IDT electrode in the acoustic wave device according to the fifth preferred embodiment of the present invention.

FIG. 8 is a cross-sectional view showing a vicinity of an IDT electrode in an acoustic wave device according to a fifth preferred embodiment of the present invention. FIG. 9 is a plan view showing a vicinity of the IDT electrode in the acoustic wave device according to the fifth preferred embodiment.

As shown in FIG. 8, the fifth preferred embodiment is different from the first preferred embodiment in that the main surface 2a of the support substrate 2 includes a plurality of first regions A, multilayer bodies are respectively provided in the plurality of first regions A on the main surface 2a of the support substrate 2, and the IDT electrodes are respectively provided on the piezoelectric layers of the respective multilayer bodies. Note that the side surface of each multilayer body is covered with the insulating film 7. Aside from the points described above, the acoustic wave device according to the fifth preferred embodiment has the same or similar features and elements as that of the acoustic wave device according to the third preferred embodiment.

More specifically, the support substrate 2 includes a first region A1 and a first region A2. On the main surface 2a of the support substrate 2, a multilayer body 32A is provided in the first region A1, and a multilayer body 32B is provided in the first region A2. In the multilayer body 32A, a piezoelectric layer 6A is provided on an intermediate layer 33A. In the multilayer body 32B, a piezoelectric layer 6B is provided on an intermediate layer 33B. An IDT electrode 8A is provided on the piezoelectric layer 6A of the multilayer body 32A, and an IDT electrode 8B is provided on the piezoelectric layer 6B of the multilayer body 32B. As shown in FIG. 9, the IDT electrode 8A and the IDT electrode 8B are electrically connected to each other by a wiring electrode as the metal film 14A. The acoustic wave device according to the fifth preferred embodiment is an acoustic wave filter including a plurality of acoustic wave resonators.

In the fifth preferred embodiment, one acoustic wave resonator is provided for one multilayer body, and the influence of the acoustic wave excited by the acoustic wave resonator on other acoustic wave resonators is able to be significantly reduced or prevented. Accordingly, deterioration in filter characteristics is able to be significantly reduced or prevented.

In addition, similar to the third preferred embodiment, in the cross-sectional view shown in FIG. 8, the side surfaces of the respective layers of the intermediate layer 33A and the intermediate layer 33B are each tilted, and the side surfaces of the intermediate layer 33A and the intermediate layer 33B each have an uneven structure. Accordingly, the area of the interface between the multilayer body 32 and the insulating film 7 is able to be significantly increased, and peeling of the insulating film 7 from the multilayer body 32 is able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate including a main surface including a first region and a second region adjacent to the first region in a plan view;
   a multilayer body including an intermediate layer in the first region of the support substrate and a piezoelectric layer on the intermediate layer, and including a side surface;
   an IDT electrode on the piezoelectric layer of the multilayer body; and
   an insulating film in the second region of the support substrate and covering the side surface of the multilayer body; wherein
   an angle defined between the main surface of the support substrate and the side surface of the multilayer body is a tilt angle, and the side surface of the multilayer body includes portions having different tilt angles at a portion covered with the insulating film.

2. The acoustic wave device according to claim 1, wherein
   the piezoelectric layer and the intermediate layer each include a side surface; and
   a tilt angle of the side surface of the piezoelectric layer is smaller than a tilt angle of the side surface of a layer adjacent to the piezoelectric layer in the intermediate layer.

3. The acoustic wave device according to claim 1, wherein
   the intermediate layer includes a plurality of layers each including a side surface; and
   a tilt angle of the side surface of at least one layer among the plurality of layers is different from a tilt angle of the side surface of another layer.

4. The acoustic wave device according to claim 1, wherein
   the support substrate is a high acoustic velocity support substrate;
   the intermediate layer is a low acoustic velocity film provided on the high acoustic velocity support substrate;
   an acoustic velocity of a bulk wave propagating through the high acoustic velocity support substrate is higher than an acoustic velocity of an acoustic wave propagating through the piezoelectric layer; and
   an acoustic velocity of a bulk wave propagating through the low acoustic velocity film is lower than an acoustic velocity of a bulk wave propagating through the piezoelectric layer.

5. The acoustic wave device according to claim 1, wherein
   the intermediate layer includes a high acoustic velocity film provided on the support substrate, and a low acoustic velocity film provided on the high acoustic velocity film;
   an acoustic velocity of a bulk wave propagating through the high acoustic velocity film is higher than an acoustic velocity of an acoustic wave propagating through the piezoelectric layer; and
   an acoustic velocity of a bulk wave propagating through the low acoustic velocity film is lower than an acoustic velocity of a bulk wave propagating through the piezoelectric layer.

6. The acoustic wave device according to claim 1, wherein
   the intermediate layer is an acoustic reflection film provided on the support substrate; and
   the acoustic reflection film includes a high acoustic impedance layer relatively high in acoustic impedance and a low acoustic impedance layer relatively low in acoustic impedance, and the high acoustic impedance layer and the low acoustic impedance layer are alternately laminated.

7. The acoustic wave device according to claim 3, wherein the intermediate layer includes a plurality of metal layers and an insulating layer provided between the plurality of metal layers, and the plurality of metal layers and the insulating layer each include a side surface; and
a connection electrode which electrically connects the plurality of metal layers to each other is provided on the side surface of the insulating layer.

8. The acoustic wave device according to claim 1, wherein a metal film which extends from a top of the piezoelectric layer to a top of the insulating film is provided.

9. The acoustic wave device according to claim 1, wherein the piezoelectric layer includes a first main surface and a second main surface facing each other, the IDT electrode is provided on the first main surface, and the insulating film extends onto the first main surface.

10. The acoustic wave device according to claim 1, wherein
the main surface of the support substrate includes a plurality of the first regions;
the multilayer body is provided in each of the plurality of first regions of the support substrate, and the IDT electrode is provided on the piezoelectric layer of each of the multilayer bodies; and
the side surface of each of the multilayer bodies is covered with the insulating film.

11. The acoustic wave device according to claim 1, wherein the insulating film is a photosensitive polyimide film.

12. The acoustic wave device according to claim 1, wherein, in the plan view, the insulating film is in contact with an entire or substantially an entire circumference of the side surface of the multilayer body.

13. The acoustic wave device according to claim 8, wherein the metal film is a wiring electrode that is electrically connected to the IDT electrode.

14. The acoustic wave device according to claim 1, wherein, in the plan view, a boundary between the multilayer body and the insulating film is covered with a metal film.

15. The acoustic wave device according to claim 1, wherein the tilt angle of the side surface of each layer of the multilayer body is less than about 90°.

16. The acoustic wave device according to claim 4, wherein
the high acoustic velocity support substrate is a silicon substrate; and
the low acoustic velocity film is a silicon oxide film.

17. The acoustic wave device according to claim 1, wherein the intermediate layer includes only a single film layer.

* * * * *